(12) United States Patent
Pain

(10) Patent No.: US 8,089,070 B2
(45) Date of Patent: Jan. 3, 2012

(54) APPARATUS AND METHOD OF MANUFACTURE FOR AN IMAGER EQUIPPED WITH A CROSS-TALK BARRIER

(75) Inventor: Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 24 days.

(21) Appl. No.: 11/674,608

(22) Filed: Feb. 13, 2007

(65) Prior Publication Data

US 2007/0187722 A1 Aug. 16, 2007

Related U.S. Application Data

(60) Provisional application No. 60/774,123, filed on Feb. 16, 2006.

(51) Int. Cl.
*H01L 29/04* (2006.01)
(52) U.S. Cl. .......... 257/60; 257/215; 257/291; 257/292; 257/E27.133; 257/E27.142
(58) Field of Classification Search .................. 257/291, 257/292, 233, E31.058, E21.133, 222, E27.142, 257/E27.154, E27.133, 60, 215
See application file for complete search history.

(56) References Cited

U.S. PATENT DOCUMENTS

| | | | |
|---|---|---|---|
| 4,673,964 A * | 6/1987 | Popovic et al. | 257/427 |
| 6,111,299 A * | 8/2000 | Dabrowski et al. | 257/438 |
| 6,701,782 B2 | 3/2004 | Iwaki et al. | |
| 2001/0017371 A1 * | 8/2001 | Tanaka et al. | 257/59 |
| 2001/0042875 A1 * | 11/2001 | Yoshida | 257/291 |
| 2003/0124763 A1 * | 7/2003 | Fan et al. | 438/70 |
| 2003/0183850 A1 | 10/2003 | Pain et al. | 257/200 |
| 2005/0041296 A1 * | 2/2005 | Hsiao et al. | 359/619 |
| 2006/0068586 A1 | 3/2006 | Pain | 438/643 |
| 2006/0076590 A1 | 4/2006 | Pain et al. | 257/294 |

OTHER PUBLICATIONS

U.S. Appl. No. 60/861,688, filed Nov. 29, 2006.
U.S. Appl. No. 11/947,627, filed on Nov. 29, 2007.
Non-Final Office Action from U.S. Appl. No. 12/632,583, dated Feb. 4, 2011.
Non-Final Office Action from U.S. Appl. No. 12/632,583, dated Aug. 18, 2011.

* cited by examiner

*Primary Examiner* — Bradley K Smith
*Assistant Examiner* — Mohammad Karimy
(74) *Attorney, Agent, or Firm* — Zilka-Kotab, PC

(57) ABSTRACT

An imager apparatus and associated starting material are provided. In one embodiment, an imager is provided including a silicon layer of a first conductivity type acting as a junction anode. Such silicon layer is adapted to convert light to photoelectrons. Also included is a semiconductor well of a second conductivity type formed in the silicon layer for acting as a junction cathode. Still yet, a barrier is formed adjacent to the semiconductor well. In another embodiment, a starting material is provided including a first silicon layer and an oxide layer disposed adjacent to the first silicon layer. Also included is a second silicon layer disposed adjacent to the oxide layer opposite the first silicon layer. Such second silicon layer is further equipped with an associated passivation layer and/or barrier.

21 Claims, 5 Drawing Sheets

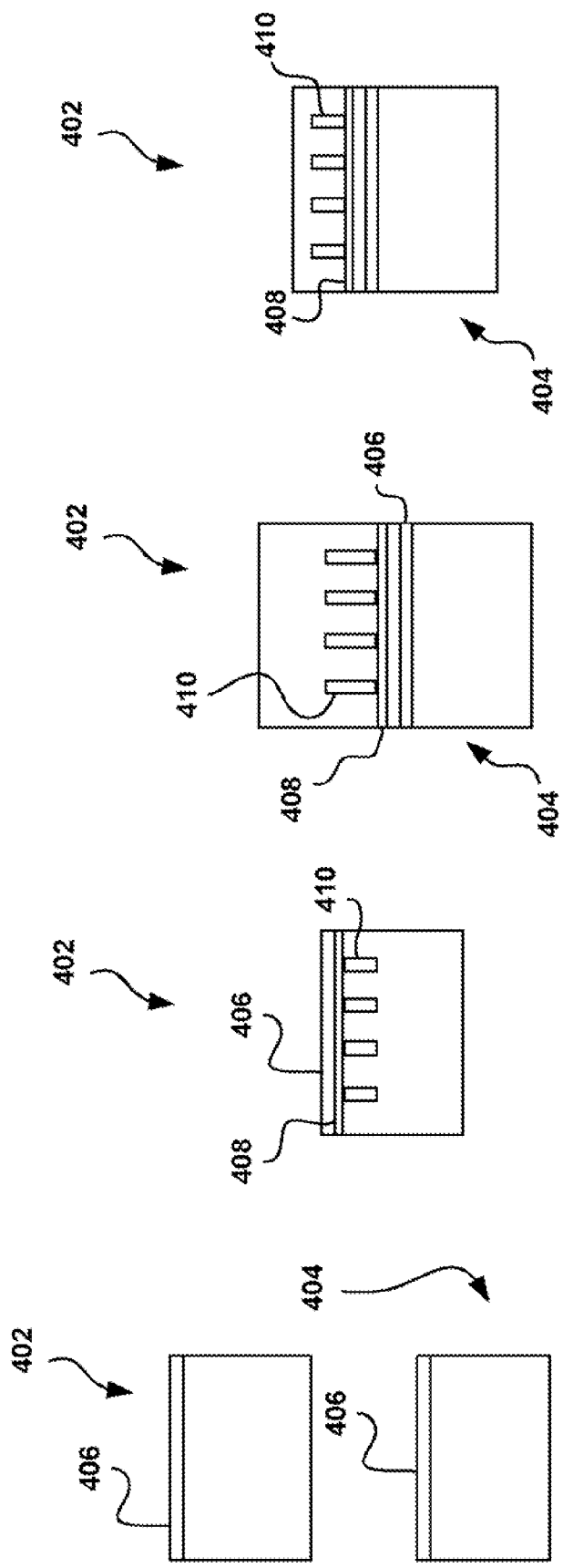

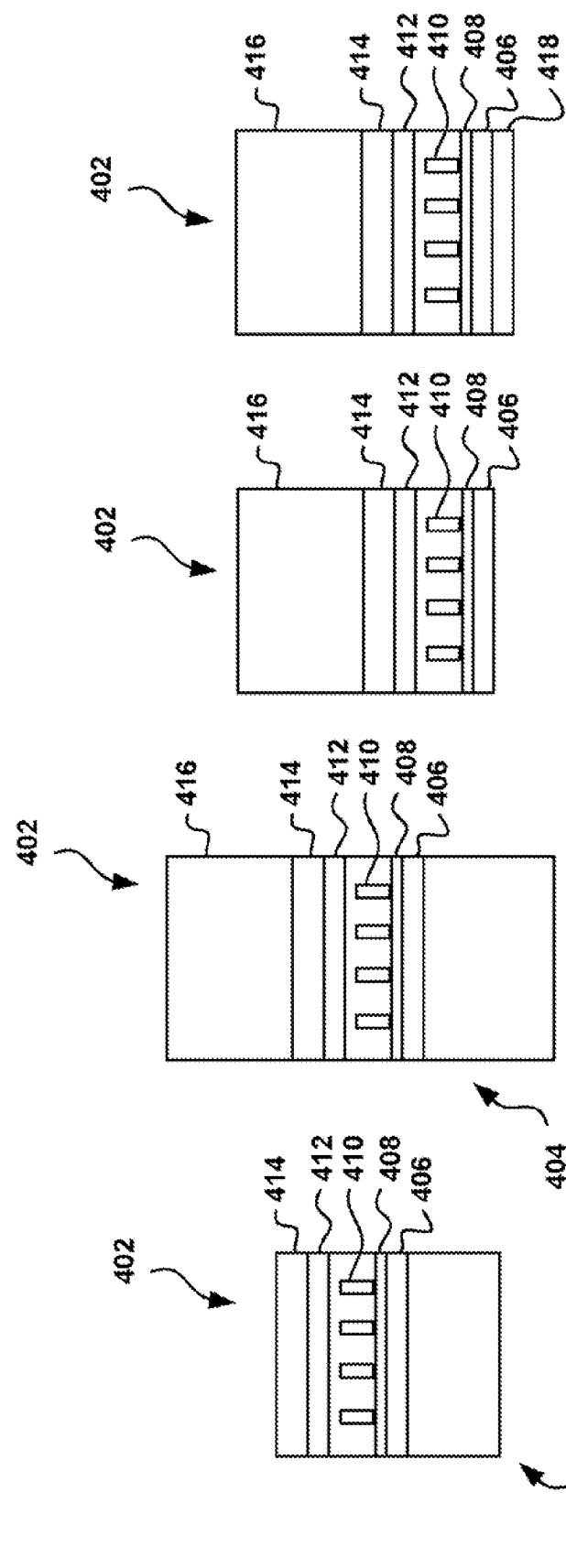

APPARATUS AND METHOD OF MANUFACTURE FOR AN IMAGER EQUIPPED WITH A CROSS-TALK BARRIER

RELATED APPLICATION(S)

The present application claims the benefit of a provisional application filed on Feb. 16, 2006 under application Ser. No. 60/774,123, which is incorporated herein by reference in its entirety for all purposes.

STATEMENT REGARDING FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The present invention relates to optical sensors, and more particularly to imagers.

BACKGROUND

Cross-talk poses a significant problem for imagers (e.g. CMOS imagers, etc.). Typically, cross-talk may include the collection of photo-carriers (e.g. electrons, etc.) by imager pixels other than the one that was supposed to have collected such photo-carriers. Three types of imager cross-talk typically include spectral cross-talk, optical cross-talk, and diffusion cross-talk. Such cross-talk typically results in images with poor contrast, blurring of edges, improper color perception, non-uniform response over a field-of-view, etc.

Elimination of diffusion cross-talk, in particular, requires the collection of all photo-carriers under the influence of an electric field. A relatively high epitaxial doping that imagers typically require, coupled with continuous voltage scaling, have resulted in imager structures with depletion widths far smaller than the absorption depths of visible light. Thus, for the most part, photo-carriers in epitaxial silicon are often collected at a surface or near-surface p-n junction (or the like) through diffusion, rather than under the influence of a vertical electric field. Thus, since diffusion is an omni-directional process, lateral diffusion typically gives rise to unwanted diffusion cross-talk.

There is thus a need for addressing these and/or other issues associated with the prior art.

SUMMARY

An imager apparatus and associated starting material are provided. In one embodiment, an imager is provided including a silicon layer of a first conductivity type acting as a junction anode. Such silicon layer is adapted to convert light to photoelectrons. Also included is a semiconductor well of a second conductivity type formed in the silicon layer for acting as a junction cathode. Still yet, a barrier is formed adjacent to the semiconductor well.

In various aspects of the present embodiment, such barrier may potentially serve to reduce diffusion cross-talk, improve the funneling of the photoelectrons to the semiconductor well, etc. As a further option, a passivation layer may be disposed adjacent to the silicon layer for additionally enhancing operation of the imager apparatus, etc.

In another embodiment, a starting material is provided including a first silicon layer and an oxide layer disposed adjacent to the first silicon layer. Also included is a second silicon layer disposed adjacent to the oxide layer opposite the first silicon layer. Such second silicon layer is further equipped with an associated passivation layer and/or barrier.

BRIEF DESCRIPTION OF THE DRAWINGS

FIGS. 4A-4H illustrate various stages of processing, in accordance with the method of FIG. 3.

DETAILED DESCRIPTION

Figure 1:
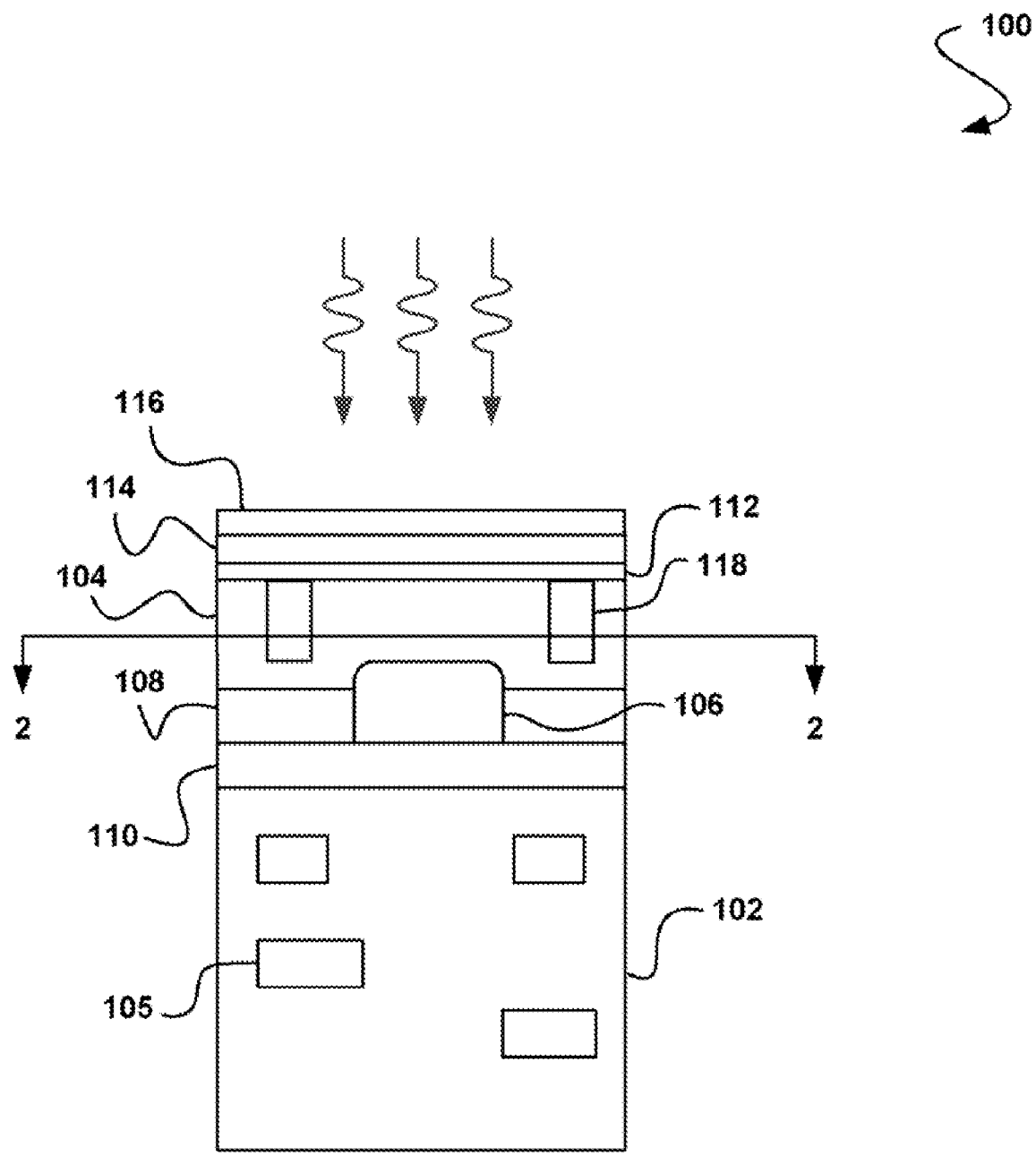
FIG. 1 illustrates a cross-section of an imager apparatus, in accordance with one embodiment.

FIG. 1 illustrates a cross-section of an imager apparatus 100, in accordance with one embodiment. In the present embodiment, the imager apparatus 100 may include a back-illuminated imager. While the imager apparatus 100 shown in FIG. 1 may represent a single imager pixel, it should be note that an array of such pixels may be provided, in different embodiments.

Still yet, such imager apparatus 100 may be manufactured utilizing complimentary metal-oxide semiconductor (CMOS) technology. Of course, however, other types of imager apparatuses, manufacturing processes, etc. are contemplated. For example, the imager apparatus 100 may also take the form of a charge coupled device (CCD) imager.

As shown, an inter-layer dielectric (ILD) 102 is provided which is formed on the silicon wafer. Also included a silicon layer 104 of a first conductivity type acting as a junction anode. In use, such silicon layer 104 is adapted to convert light to photoelectrons. As further shown metal layers 105 may be provided for interconnection of circuits and photo-detectors fabricated on the silicon layer (combined 104, 106, 108). Such metal layers 105 are separated and protected by the ILD 102. In one optional embodiment, the ILD 102 may extend a depth of 10 micrometers, or any other desired depth, for example.

Also included is a semiconductor well 106 of a second conductivity type formed in the silicon layer 104 for acting as a junction cathode. In one embodiment, the first conductivity type may include a p-type conductivity, and the second conductivity type may include an n-type conductivity. Of course, other embodiments are contemplated where the first conductivity type may include an n-type conductivity, and the second conductivity type may include a p-type conductivity. Still yet, in one embodiment, the semiconductor well 106 may take the form of a deep implanted n-well but, of course, may take other forms as well (such as a stacked layers of n-type and p-type implants, etc.).

Further provided is an implant region 108 of the first conductivity type disposed about the semiconductor well 106 and just above an oxide layer 110 that resides between the silicon layer 104 and the ILD 102, in the manner shown. Disposed over the silicon layer 104 is a passivation layer 112 of the first conductivity type. Such implant region 108 and the passivation layer 112 may, in one embodiment, be more heavily doped with respect to the silicon layer 104, for reasons that will soon become apparent. Further, during use, the passivation layer 112 may serve a variety of purposes, examples of which will be set forth hereinafter in the context of different embodiments.

Disposed over the passivation layer 112 is an anti-reflection layer (ARC) 114. Also, one or more color filter layers 116 may be disposed over the anti-reflection layer 114. Again, see FIG. 1.

Still yet, a barrier 118 of the first conductivity type is formed in the silicon layer 104 adjacent to the semiconductor well 106. In the context of the present description, the barrier 118 refers to a structure that is formed, disposed, etc. in any manner that serves as a barrier, at least in part. In various embodiments, for example, the barrier 118 may take the form of one or more posts or pickets, a hollow cylinder, a hollow rectangular structure, etc. surrounding the semiconductor well 106. Further, the position, size, shape, etc. of the barrier 118 may deviate from that specifically shown in FIG. 1, insofar as the aforementioned definition is met.

In FIG. 1, the barrier 118 is shown to extend from the passivation layer 112 to a point spaced from the implant region 108. Of course, during operation, an operation region associated with the barrier 118 may or may not extend completely to the implant region 108.

During operation, the barrier 118 may or may not serve to reduce cross-talk (e.g. diffusion cross-talk, etc.) at least in part, improve the funneling of the photoelectrons to the semiconductor well 106, etc. Further, the implant region 108 may optionally work in conjunction with the barrier 118 for further reducing cross-talk, directing photoelectrons, etc. Also during use, leakage (e.g. dark current, etc.) and/or blue quantum efficiency (QE) issues may or may not be addressed utilizing the passivation layer 112, in a manner that will be elaborated upon hereinafter during reference to different embodiments.

More illustrative information will now be set forth regarding various optional architectures and features of different embodiments with which the foregoing technique may or may not be implemented, per the desires of the user. It should be strongly noted that the following information is set forth for illustrative purposes and should not be construed as limiting in any manner. Any of the following features may be optionally incorporated with or without the other features described.

In one example of use, incident light may pass through the color filter layers 116, ARC layer 114, and passivation layer 112 before being absorbed in the underlying silicon layer 104. As mentioned earlier, the silicon layer 104 may include a low-doped silicon, with a heavily-doped surface (see passivation layer 112) and a heavily-doped deeper silicon barrier 118 that penetrates the silicon layer 104. The photoelectrons generated in the silicon layer 104 are collected in the reverse-biased junction (e.g. p-n junction, etc.) formed between the semiconductor well 106 and the silicon layer 104.

During use, the passivation layer 112 may serve a variety of purposes. For example, the passivation layer 112 may serve to hold the adjacent surface of the silicon layer 104 in accumulation (i.e. at one potential, etc.), thus preventing interface traps from being electrically active, for passivating them. Being electrically inactive, the traps are incapable of fully participating in the thermal dark current generation process, nor do they fully trap photoelectrons generated near the surface of the silicon layer 104.

As a corollary to the above feature, blue light may be absorbed close to the surface of the silicon layer 104, as a result of the passivation layer 112. To this end, blue QE is preserved.

Still yet, in various embodiments, the passivation layer 112 may serve to drive photo-carriers into the silicon layer 104 and towards the semiconductor well 106. This may result from the fact that the passivation layer 112 is "smeared" during associated thermal processing (which will be described later in greater detail) such that the doping is of a higher concentration at an upper surface and dissipates thereeneath. Such doping gradient, in turn, creates a vertical field that drives the photo-carriers in the abovementioned manner.

In the embodiment shown in FIG. 1, the barrier 118 surrounds the semiconductor well 106. By this structure, the barrier 118 provides potential barriers to lateral electron flow, preventing lateral diffusion and therefore suppressing diffusion cross-talk, at least in part. In various different embodiments, the implant energy and dose of the implant region 108 and barrier 118 may be chosen such that their respective regions touch each other vertically, providing an enhanced potential barrier to lateral electron flow. Through the use of the lower-doped silicon layer 104, semiconductor well 106, barrier 118, and implant region 108; each pixel may be optically and/or electrically isolated from each other. In addition to the foregoing features, the barrier 118 may also work in conjunction with the passivation layer 112 and implant region 108 for further funneling any photo-carriers into the silicon layer 104 and towards the semiconductor well 106.

Thus, any carriers generated in the semiconductor well 106 may, in some embodiments, be collected with 100% (or near 100%) collection efficiency, since the semiconductor well 106 is bounded by the implant region 108, the barrier 118, passivation layer 112, providing a potential barrier to electron back-flow out of the semiconductor well 106, etc. To this end, each pixel may provide 100% (or near 100%) quantum yield over a wavelength of response, while the top ARC 114 minimizes reflection loss. Together, such features may provide high QE and low pixel-to-pixel cross-talk.

In one possible embodiment, the apparatus 100 may represent one of a multiplicity of devices that are configured in a system array. An illustrative example of such system array may be found with reference to U.S. Patent Application Publication No.: 2006/0076590A1 filed Sep. 13, 2005, which is incorporated herein by reference in its entirety for all purposes. Of course, such exemplary system array is set forth for illustrative purposes only and should not be construed as limiting in any manner whatsoever.

Figure 2A:
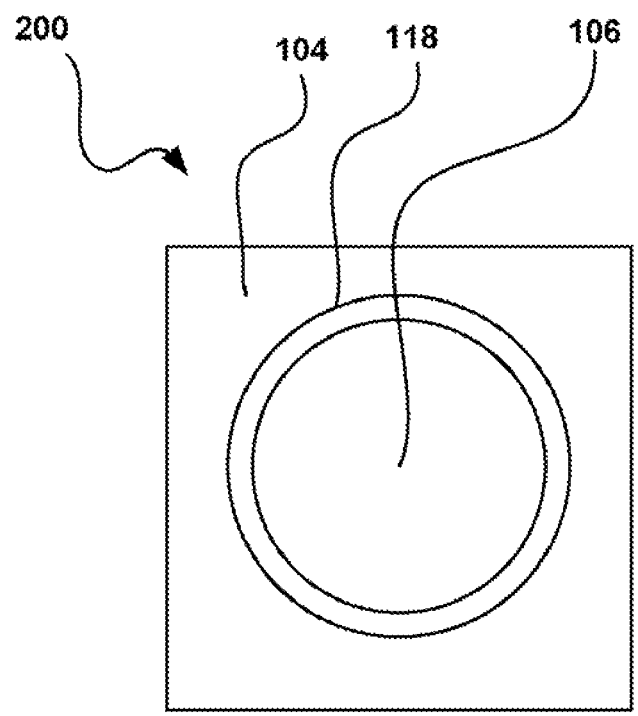
FIG. 2A shows an exemplary cross-section of the barrier of FIG. 1 that is taken along line 2-2 of FIG. 1, in accordance with another embodiment.

FIG. 2A shows an exemplary cross-section 200 of the barrier 118 of FIG. 1 that is taken along line 2-2 of FIG. 1, in accordance with another embodiment. As shown, the barrier 118 is formed in the silicon layer 104 and circumnavigates the semiconductor well 106. While the barrier 118 of FIG. 2A is shown to be continuous in form and to surround the semiconductor well 106, it should be noted that the periphery of the barrier 118 may be discontinuous, vary in shape, size, etc. Further, while a circular shape is illustrated, such shape may deviate as well. See FIG. 2B, for example.

Figure 2B:
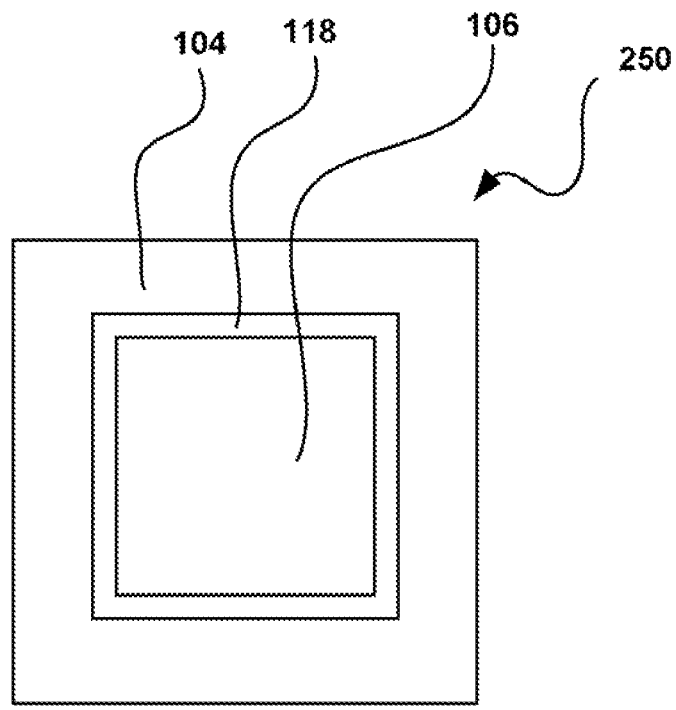
FIG. 2B shows another exemplary cross-section of the barrier of FIG. 1 that is taken along line 2-2 of FIG. 1, in accordance with yet another embodiment.

FIG. 2B shows another exemplary cross-section 250 of the barrier 118 of FIG. 1 that is taken along line 2-2 of FIG. 1, in accordance with yet another embodiment. As shown, the barrier 118 is formed in the silicon layer 104 and circumnavigates the semiconductor well 106. Further, the present barrier 118 is shown to be rectangular in shape. Similar to the embodiment of FIG. 2A, a periphery of the barrier 118 may be discontinuous, vary in shape, size, etc.

Figure 3:
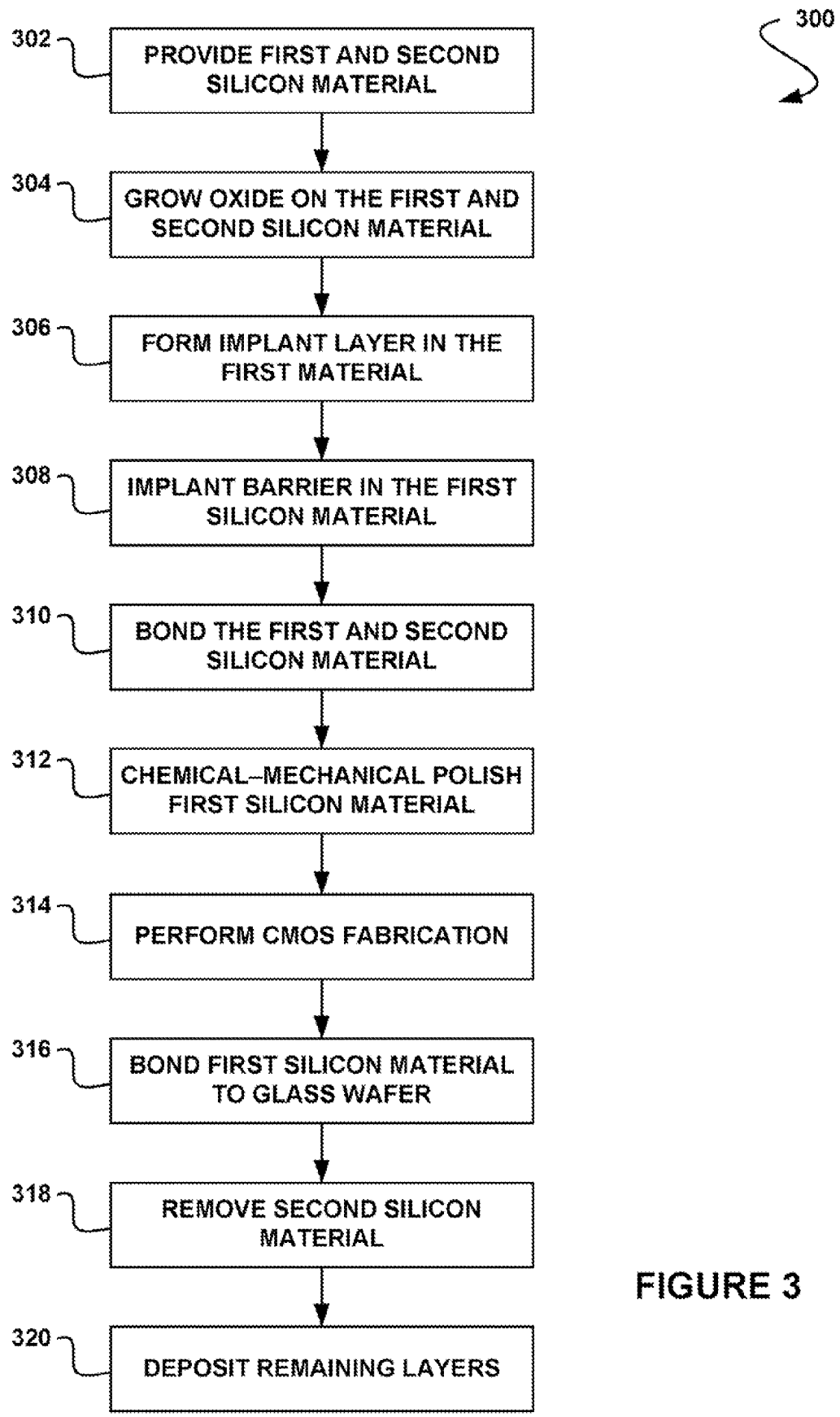
FIG. 3 illustrates a method for manufacturing a starter material and a resultant imager, in accordance with another embodiment.

FIG. 3 illustrates a method 300 for manufacturing a starter material and a resultant imager, in accordance with another embodiment. As an option, the method 300 may be used to manufacture the imager apparatus 100 of FIG. 1. Further, the definitions provided above may equally apply to the present description.

As shown, a first silicon material (e.g. device silicon wafer, etc.) and a second silicon material (e.g. support/handle silicon wafer, etc.) are provided. See operation 302. Thereafter, an oxide is grown on the first and second silicon material, as shown in operation 304. In one embodiment, such oxide may exhibit enhanced purity. FIG. 4A illustrates a first silicon material 402 and a second silicon material 404 each with an oxide 406 formed thereon. While the oxide 406 is shown to be grown on the second silicon material 404, it should be noted that such oxide 406 may be omitted in other embodiments. As an option, oxide may be grown only on the first silicon material 402, only on the second silicon material 404, etc., and such silicon 402, 404 may bond to the oxide (e.g. as in operation 310).

Next, in operation 306, an implantation layer is formed in the first silicon material. In one embodiment, a blanket of Boron may be implanted. Of course, other elements may be used in other embodiments. In use, much implanted ions are adapted to penetrate the oxide grown in operation 304.

Still yet, in operation 308, a barrier is implanted in the first silicon material. Such barrier may take on any form set forth hereinabove. To accomplish this, in accordance with one embodiment, a wafer may be patterned with photoresist, so that Boron (or any other element, etc.) may be implanted at the appropriate places, in order to create the barrier structure. As an option, the blanket implantation may be utilized without necessarily utilizing the barrier.

FIG. 4B illustrates the first silicon material 402 with both the implantation layer 408 and barriers 410 formed therein. In one embodiment, the barriers 410 may be implanted to penetrate 2 micrometers into the first silicon material 402. It should be noted that multiple barriers 410 are shown in FIG. 4B, since multiple devices are to be formed therein, as well will soon be set forth.

Turning now to operation 310, the oxides of the first and second silicon material are bonded. In various embodiments, this may be accomplished utilizing a low heat bonding process, or any other desired process, for that matter. Specifically, in one embodiment, the first and second silicon materials may undergo low temperature oxide-to-oxide or oxide-to-silicon bonding, thereby forming a buried oxide structure with a top layer consisting of the device silicon and the barrier structure. As an option, such low temperature bonding may be followed by a higher temperature annealing process.

Next, a CMP, or a lapping and polishing, process if employed to reduce a depth of the first silicon material. See operation 312. Such CMP/lapping process may be followed by a wet-etch and polish process to generate a silicon layer of appropriate thickness. FIG. 4C illustrates the first and second silicon material 402, 404 bonded to each other, while FIG. 4D shows the first silicon material 402 after the aforementioned CMP.

It should be noted that the structure of FIG. 4D may be achieved in any desired manner. [For example, a silicon material may be provided with a pure oxide disposed thereon. Next, the barrier and/or implantation layer may be deposited, after which additional silicon material may be grown over the barrier and/or implantation layer. To this end, the structure in FIG. 4C may not necessarily be formed with the barrier 410 and/or implantation layer 408 built-in. In one embodiment, if the implantation layer 408 is missing, it may be added utilizing implantation. In another optional embodiment, if barrier 410 is missing, it may be added via masking and selective implantation, thus resulting in the structure of FIG. 4D.

With continuing reference to FIG. 3, a CMOS fabrication process is then carried out, per operation 314. In one possible embodiment, a bulk CMOS process flow may be used to generate a plurality of CMOS imagers through implantation, oxidation, ILD, metal deposition, and/or patterning at the wafer level. It should be noted that any bulk CMOS process may be used. For example, a bulk CMOS process may be optimized for imaging. By this process, various structures may be formed including, but not limited to a deep semiconductor well, MOSFETs, capacitors, and/or other devices. FIG. 4E shows the first silicon material 402 after the aforementioned CMOS, where the resultant structure includes a device layer 412 and ILD 414 as shown.

In operation 316, the first silicon material is bonded to a glass wafer for mechanical support. Further, in operation 318, the second silicon material is removed, through mechanical grinding, wet etching, and/or reactive ion etching (RIE), for example. FIG. 4F illustrates the first silicon material 402 being bonded to a glass or silicon wafer or other substrate 416, and FIG. 4G illustrates the second silicon material 404 being removed, at least in part.

Thereafter, an ARC layer is deposited. See operation 320 and item 418 in FIG. 4H. Such ARC layer is capable of providing improved optical coupling through a suppression of reflection at the silicon material/oxide (e.g. Si—$SiO_2$, etc.) interface.

In various embodiments, the quality of the Si—SiO2 interface at the exposed back silicon surface may play a role in short wavelength QE and dark current. An increased number of interface traps that is associated with surface damage and dangling bonds may cause unwanted potential build up at the back-surface that may prevent the photoelectrons generated by blue light close to the surface from being collected, wile the density of interface traps may increase the dark current. Both of these effects may be eliminated by keeping the back Si—SiO2 interface in thermal equilibrium.

The foregoing description has set forth only a few of the many possible implementations. For this reason, this detailed description is intended by way of illustration, and not by way of limitations. Variations and modifications of the embodiments disclosed herein may be made based on the description set forth herein, without departing from the scope and spirit of the present application.

It is only the following claims, including all equivalents, that are intended to define the scope of the various embodiments. Moreover, the embodiments described above are specifically contemplated to be used alone as well as in various combinations. Accordingly, other embodiments, variations, and improvements not described herein are not necessarily excluded.

What is claimed is:

1. An apparatus, comprising:
   a silicon layer of a first conductivity type for acting as a junction anode, the silicon layer adapted to convert light to photoelectrons;
   a semiconductor well of a second conductivity type formed in the silicon layer for acting as a junction cathode;
   an implant region of the first conductivity type disposed about the semiconductor well, the implant region more heavily doped than the silicon layer;
   an oxide layer disposed directly adjacent to a first side of the implant region opposite a second side of the implant region directly adjacent to which the silicon layer is disposed; and a barrier separate from the implant region and including a hollow structure formed in the silicon layer directly and laterally adjacent to the semiconductor well;

wherein the barrier includes a continuous barrier surrounding the semiconductor well and works in conjunction with the implant region to direct photoelectrons to the semiconductor well.

2. The apparatus of claim 1, wherein the barrier includes a substantially circular cross-section.

3. The apparatus of claim 1, wherein the barrier includes a substantially rectangular cross-section.

4. The apparatus of claim 1, wherein the barrier serves to reduce cross-talk.

5. The apparatus of claim 1, wherein the barrier serves to reduce diffusion cross-talk.

6. The apparatus of claim 1, and further comprising a passivation layer disposed directly and vertically adjacent to the silicon layer.

7. The apparatus of claim 6, and further comprising an anti-reflection layer disposed directly adjacent to the passivation layer.

8. The apparatus of claim 7, and further comprising at least one color filter layer disposed directly adjacent to the anti-reflection layer.

9. The apparatus of claim 6, wherein the passivation layer is utilized for preventing interface traps, such that the interface traps are incapable of fully participating in a thermal dark current generation process.

10. The apparatus of claim 1, wherein the apparatus includes a back-illuminated imager.

11. The apparatus of claim 10, wherein the imager includes a charge coupled device (CCD) imager.

12. The apparatus of claim 10, wherein the imager includes a complimentary metal-oxide semiconductor (CMOS) imager.

13. The apparatus of claim 1, wherein each of the at least one barrier is included in each imager pixel.

14. The apparatus of claim 1, wherein each of the at least one barrier continuously surrounds the semiconductor well to provide a barrier to lateral electron flow for preventing lateral diffusion and at least partially suppressing diffusion cross-talk.

15. The apparatus of claim 1, wherein each of the at least one barrier is formed on a first side of the silicon layer opposite a second side of the silicon layer in which the semiconductor well is formed.

16. A starting material, comprising:
a first silicon layer;
an oxide layer disposed adjacent to the first silicon layer; and
a second silicon layer disposed adjacent to the oxide layer on a first side of the oxide layer that is opposite a second side of the oxide layer adjacent to which the first silicon layer is disposed, the second silicon layer having an associated passivation layer;
an implantation layer formed in the second silicon layer including ions adapted to penetrate the oxide layer;
at least one barrier separate from the implantation layer and including a hollow structure formed in the second silicon layer; and
a structure formed in each of the at least one barrier, the structure including one of a deep semiconductor well, a capacitor, and a metal-oxide-semiconductor field-effect transistor (MOSFET).

17. The starting material of claim 16, wherein the passivation layer is disposed directly adjacent to the second silicon layer.

18. The starting material of claim 16, wherein each of the at least one barrier is disposed directly and laterally adjacent to the second silicon layer.

19. The starting material of claim 16, wherein the starting material is adapted for use in the manufacture of an imager.

20. The starting material of claim 16, wherein the first silicon layer includes a support silicon layer.

21. The starting material of claim 16, wherein the second silicon layer includes a device silicon layer.

* * * * *

UNITED STATES PATENT AND TRADEMARK OFFICE
CERTIFICATE OF CORRECTION

PATENT NO.         : 8,089,070 B2
APPLICATION NO.    : 11/674608
DATED              : January 3, 2012
INVENTOR(S)        : Bedabrata Pain It is certified that error appears in the above-identified patent and that said Letters Patent is hereby corrected as shown below:

Claim 16, col. 8, line 10; please insert --directly-- after "disposed" and before "adjacent".

Signed and Sealed this
Seventeenth Day of April, 2012

David J. Kappos
*Director of the United States Patent and Trademark Office*